United States Patent [19]

Roberts

[11] Patent Number: 5,560,745
[45] Date of Patent: Oct. 1, 1996

[54] ORIENTED PARTICLES IN HARD SURFACES

[76] Inventor: Ellis E. Roberts, P.O. Box 6310, Los Osos, Calif. 93412

[21] Appl. No.: 445,077

[22] Filed: May 19, 1995

Related U.S. Application Data

[60] Division of Ser. No. 322,681, Oct. 12, 1994, Pat. No. 5,453,106, and a continuation-in-part of Ser. No. 144,053, Oct. 27, 1993, abandoned.

[51] Int. Cl.⁶ ..................................................... B23F 21/03
[52] U.S. Cl. ............................................ 451/540; 407/29.1
[58] Field of Search ................................ 451/540; 29/78; 407/29.11, 29.12, 29.13, 29.14, 29.15

[56] References Cited

U.S. PATENT DOCUMENTS

| | | | |
|---|---|---|---|
| 3,230,672 | 1/1966 | Anthon | 451/530 |
| 3,906,684 | 9/1975 | Marshall et al. | 51/295 |
| 3,918,217 | 11/1975 | Oliver | 51/293 |
| 3,963,458 | 6/1976 | Gladstone et al. | 51/295 |
| 4,047,902 | 9/1977 | Wiand | 51/295 |
| 4,240,807 | 12/1980 | Kronzer | 51/295 |
| 4,317,660 | 3/1982 | Kramis et al. | 51/295 |
| 4,916,869 | 4/1990 | Oliver | 51/293 |
| 4,925,457 | 5/1990 | Dekok et al. | 51/293 |
| 5,107,626 | 4/1992 | Mucci | 51/281 |
| 5,152,917 | 10/1992 | Pieper et al. | 51/295 |
| 5,203,881 | 4/1993 | Wiand | 51/293 |
| 5,213,589 | 5/1993 | Ronning et al. | 51/293 |
| 5,239,784 | 8/1993 | Stanfield | 51/209 |
| 5,250,084 | 10/1993 | Lansell et al. | 51/293 |
| 5,273,558 | 12/1993 | Nelson et al. | 51/298 |
| 5,304,223 | 4/1994 | Pieper et al. | 51/293 |
| 5,366,523 | 11/1994 | Rowenhorst et al. | 51/293 |
| 5,443,418 | 8/1995 | Frodin et al. | 451/540 |

FOREIGN PATENT DOCUMENTS

WO92/01827  2/1992  WIPO ............................ C30B 25/02

OTHER PUBLICATIONS

Geis, et al., "Large Area Mosaic Diamond Films Approaching Single Crystal Quality," Applied Physical Letters, vol. 58, No. 22 (Jun. 3, 1991), 2485–87.

Primary Examiner—D. S. Meislin
Assistant Examiner—Dona C. Edwards
Attorney, Agent, or Firm—Leo F. Costello

[57] ABSTRACT

An article having a hard surface of oriented particles for abrasive or wear-resistant applications is provided and includes a plurality of synthetic single crystals of diamond or cubic boron nitride, or like materials, oriented in a formation so that their corresponding crystallographic directions of maximum hardness, i.e., maximum abrasive resistance, are aligned, whereby the group of crystals, which form a working surface, exhibits a common direction of maximum hardness across the surface, and to a method of making such an article.

16 Claims, 5 Drawing Sheets

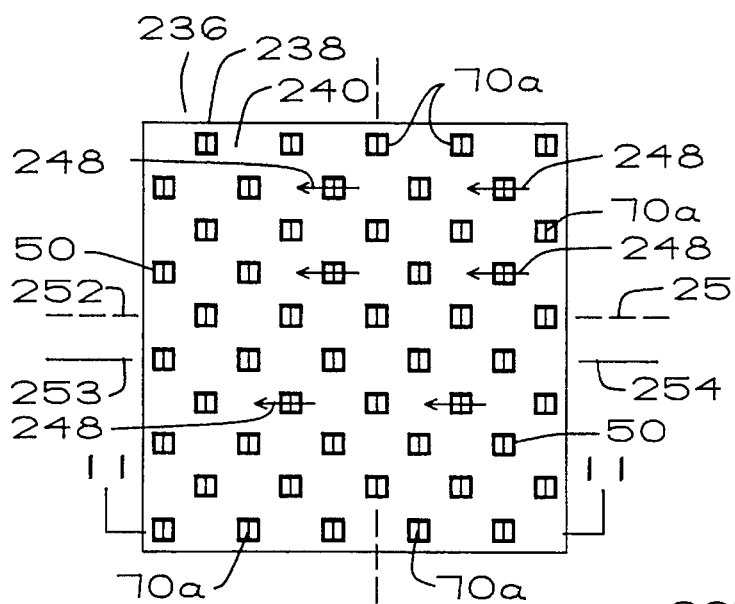
Fig. 10
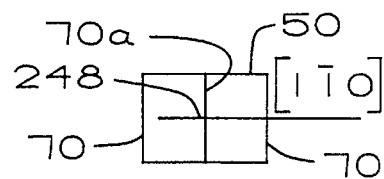
Fig. 12
Fig. 13
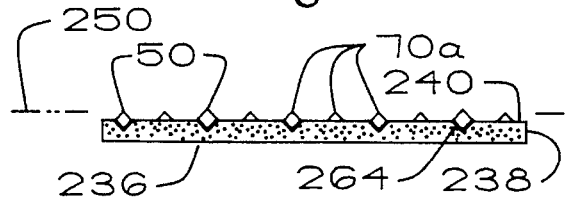
Fig. 11
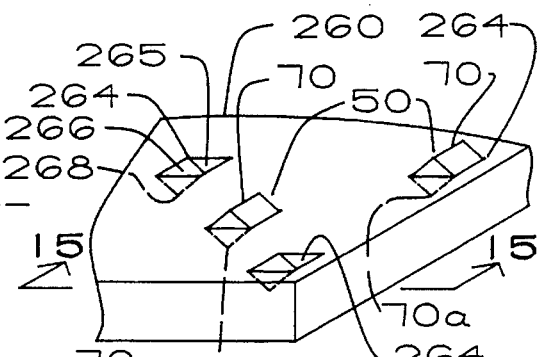
Fig. 14
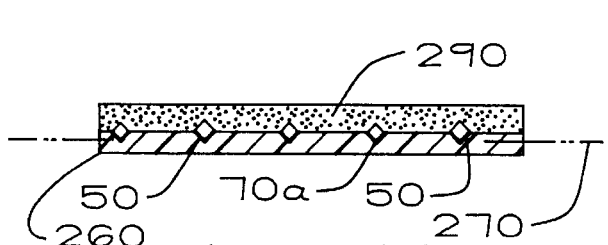
Fig. 15
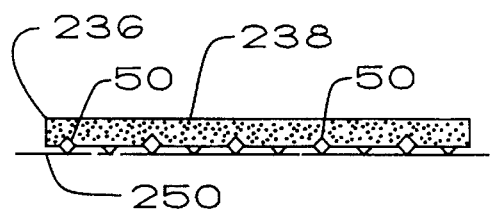
Fig. 16
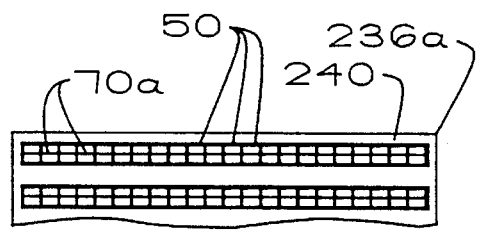
Fig. 17
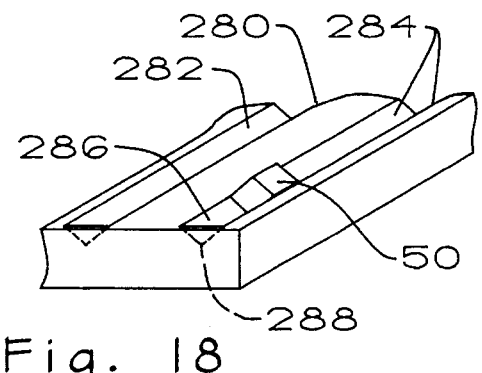
Fig. 18

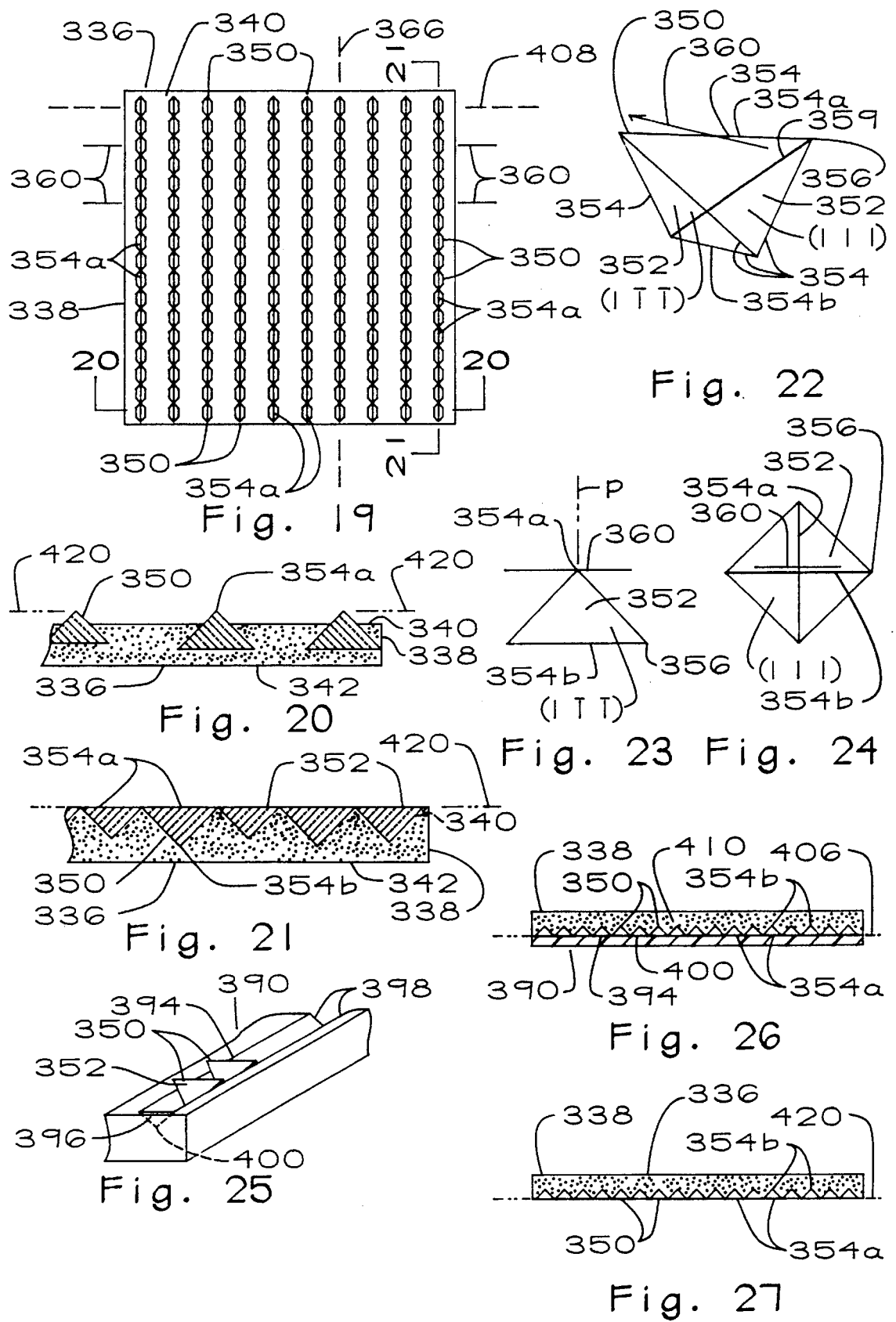

ORIENTED PARTICLES IN HARD SURFACES

CROSS-REFERENCE TO RELATED APPLICATIONS

This application is a divisional of copending application Ser. No. 08/322,681, filed Oct. 12, 1994, now U.S. Pat. No. 5,453,106, and is a continuation-in-part of copending application Ser. No. 08/144,053, filed Oct. 27, 1993, now abandoned, the latter being incorporated by reference herein.

BACKGROUND

1. Field of the Invention

This invention relates to oriented particles in hard surfaces and more particularly to an article providing a hard surface of oriented crystals for use in abrading, cutting, grinding and the like, and for use in other applications where hard surfaces are used, and to a method for making the article.

2. Discussion of the Prior Art

Hard or wear-resistant surfaces for use as abrasives in material-removal as in abrading, grinding and cutting, and for use in other application, have typically been made of particles or grits of a hard material embedded in a resinous or metallic matrix attached to a wheel, belt or other material-working tool. The grits used in the prior art have been of various hard materials, including diamond and cubic boron nitride (CBN).

The grits or particles of the prior art have been incorporated in the matrix in either a random manner or an oriented manner. The prior art orientation has been to disperse the grits uniformly, as in the U.S. Pat. No. 4,925,457 to deKok et al., dated May 15, 1990; to arrange planar faces of the grits so they seat flat against a workpiece, as in the U.S. Pat. No. 3,230,672 to Anthon, dated Jan. 25, 1966; or to orient the grit particles by electrostatic or electromagnetic means to provide better cutting surfaces, as in U.S. Pat. No. 4,240,807 to Kronzer, dated Dec. 23, 1990 and U.S. Pat. No. 5,203,881 to Wiand, dated Apr. 20, 1993.

Although these orientations may provide useful abrasive articles, these and like prior art abrasive or wear-resistant articles have failed to take advantage of the maximum hardness available in the abrasive materials used, such as diamond and CBN. The concept of orienting particles in a matrix so as to transfer to the abrasive surface as a whole the hardness qualities of the individual particles per se has not been recognized. Thus, it has not been known how to control the hardness of the surface either to insure that the resulting surface would have the maximum hardness possible or to provide a predetermined degree of hardness.

It has long been known that diamond crystals have a very high degree of abrasion resistance and that this resistance varies with the crystallographic direction of abrasion by a factor of as much as about one hundred times. This most resistant direction is along the diagonal of a cubic face in the plane of the face. (See Deeming, R. M. "Directional Grinding Hardness in Diamond," *American Mineralogist*, (1953) 38, 108–117.)

Until the present invention, however, it has not been recognized how to take advantage of such crystallographic directions of hardness of diamond, CBN, and perhaps other materials, when these materials are employed to make an article having wear-resistant or abrasive qualities. Thus, the prior art devices have not optimized the hardness characteristics of a hard surface including particles of a hard material, such as diamond and CBN.

SUMMARY

The present invention is directed to a hard or wear-resistant or abrasive surface having enhanced hardness qualities as contrasted with the prior art and more specifically to an article including a plurality of hard particles which have their crystallographic directions oriented in a predetermined manner so as to provide a hard surface of desired hardness qualities. The embodiments of the article of the present invention specifically include a plurality of crystals of diamond or cubic boron nitride, or like materials, oriented in a working surface with predetermined crystallographic directions of hardness of the crystals aligned in predetermined directions. The invention also includes a method of making such an article.

It is an object of the present invention to maximize the hardness of a surface having various industrial uses, such as in abrading, cutting, grinding and or the like, or in other applications where hard surfaces are used.

It is a feature of the subject invention to provide an article or tool including a group of abrasive grains for abrading a workpiece which, as contrasted with prior art tools: abrades faster; lasts longer; requires less frequent replacement and adjustment; is less costly to operate; maintains tolerances longer; saves abrasive material; requires less power; ,and minimizes dulling or flatting of grains.

It is a further object of this invention to maximize the hardness exhibited by a group of particles or grits of hard materials which are intended collectively to apply abrasive force.

It is another object of the present invention to take final advantage of the hardness of such materials as diamond and cubic boron nitride (CBN) in an abrasive or wear-resistant article.

It is an object of this invention to orient the crystals of a hard material in abrasive article so that when the article is used in a tool, predetermined lines of high hardness values will be aligned with the direction in which abrasive force is applied to a workpiece Yet another object is to minimize the counterproductive effects of a group of non-oriented hard particles in the matrix of an abrasive article because of failure to orient the particles in an optimum manner.

It is a feature of the subject invention is to provide a hard surface for workpiece engagement by arranging particles of a hard material in a particular manner so as to impart to the group of particles a value of hardness comparable to a maximum hardness of the individual particles, or if preferred, a near-maximum hardness of the individual particles.

It is still another object to exploit the crystallographic structures of such materials as diamond and CBN by positioning their crystals in a certain formation and orienting the crystals in the formation so as to align their maximum directions of hardness in the same direction.

It is a further object of this invention to take advantage of the fact that single crystals of diamond and CBN have maximum directions of hardness lying along lines tangential to certain portions of their crystals by aligning these directions of hardness when the crystals are positioned in an abrasive article.

It is also an object to take advantage of the fact that diamond and CBN are commercially synthesized in shapes and sizes that permit single crystals of these materials to be oriented with their crystallographic directions aligned.

It is a feature of this invention to provide an article of manufacture including a matrix containing a plurality of single crystals of substantially the same size and shape and of the same hard material namely diamond or cubic boron nitride, with the crystals all oriented so that their corresponding crystallographic directions are all aligned to provide a common direction of hardness, and to a method of making such article.

It is another feature to mount a plurality of abrasive particles having polyhedral shapes in a matrix so that each particle has one of its sharp edges exposed for workpiece engagement, so that the exposed sharp edges are in a generally saw-tooth formation, and so that the particles can traverse a workpiece in a direction perpendicularly to the sharp edges.

It is yet another feature to mount a plurality of abrasive particles in a matrix so that the particles project out of the matrix a uniform distance even though the particles differ somewhat in size.

It is still another object to provide a method for making the abrasive or wear-resistant article of the present invention.

Another object is to provide a method for facilitating the orientation of hard particles for use in abrasive articles.

Yet another object is to provide a method for making an array of hard particles for engaging a workpiece wherein the particles are individually oriented into desired positions prior to fixing the particles in the array.

Still another object is to provide a method for embedding hard particles in a matrix so that a predetermined direction of hardness of each particle will be presented to a workpiece when the particles and the workpiece are in contact and moved relatively to each other.

Another object is to provide a method for manipulating single crystals of diamond and cubic boron nitride into desired orientations so that they can be subsequently fixed in such orientations.

Still another object of this invention is to provide a method which positions the work-engaging extremities of particles of a hard material in substantially coplanar relation prior to contacting the particles with a binding matrix material.

DESCRIPTION OF THE DRAWINGS

FIG. 10 is a plan view of another embodiment of an abrasive article made in accordance with the present invention and also shown on a greatly enlarged scale from actual size.

FIG. 11 is a cross-sectional view taken along line 11—11 of FIG. 10.

FIG. 12 is an edge view of the cubic diamond crystal of FIG. 3, although on a reduced scale from FIG. 3, showing its orientation as used in the article of FIG. 10, but enlarged from FIG. 10, and further showing its second hardest directional line of hardness and Miller index.

FIG. 13 is a face view of the diamond crystal of FIG. 12.

FIG. 14 illustrates a step of an embodiment of the present method used to make the article shown in FIG. 10 and specifically is an isometric view of a corner of a template containing to cubic crystals oriented by the template into desired positions which differ from the positions of FIG. 6.

FIG. 15 illustrates a step similar to that illustrated by FIG. 8 but pertains to the method of making the article shown in FIG. 10 and specifically is a cross-section of the template and crystals therein, as if taken along line 15—15 of FIG. 14 when the template is full of crystals, and further showing a matrix of epoxy overlaying the crystals and the template.

FIG. 16 is a cross-section along the stone plane as FIG. 15 but showing the article of FIG. 10 removed from the template.

FIG. 17 is a plan view of a portion of a variation of the second embodiment of an abrasive article made in accordance with the present invention.

FIG. 18 is an isometric view of part of a template for use in making the variation shown in FIG. 17.

FIG. 19 is a plan view of a third embodiment of an abrasive article made in accordance with the present invention and also shown on a greatly enlarged scale from actual size.

FIGS. 20 and 21 are partial cross-sectional views taken along lines 20—20 and 21—21, respectively, of FIG. 19.

FIG. 22 is a greatly enlarged isometric view of a tetrahedral crystal of cubic boron nitride as used in the article of FIG. 19 but greatly enlarged from FIG. 19 and showing Miller notations for two of the faces of the crystal.

FIG. 23 is a face view of the crystal of FIG. 22 on a reduced scale and also showing a Miller notation.

FIG. 24 is an edge view of the crystal of FIG. 23 but turned ninety degrees therefrom and again showing a Miller notation.

FIG. 25 is a fragmentary isometric view similar to FIG. 18 but showing a template used to make the article of FIG. 19.

FIGS. 26 and 27 are cross-sectional views similar to FIGS. 15 and 16 but showing steps for making the article of FIG. 19 and taken along the same plane as FIG. 21.

DETAILED DESCRIPTION

Article of Manufacture—First Embodiment

Figure 1:
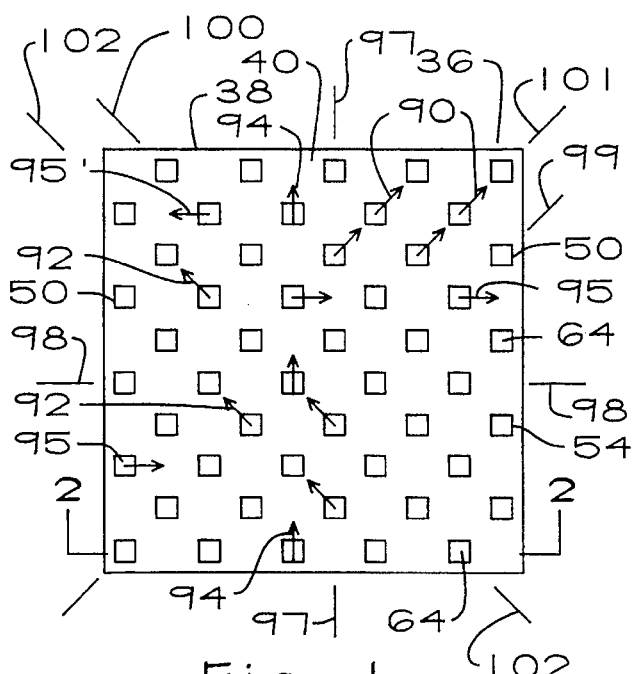
FIG. 1 is a plan view of one embodiment of an abrasive article made in accordance with the present invention but showing the article on a greatly enlarged scale from actual size.
Figure 2:
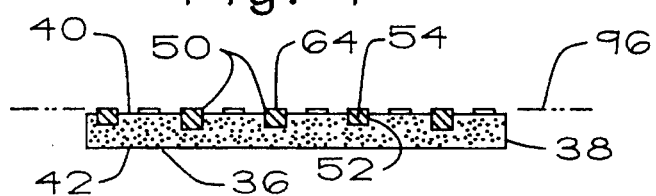
FIG. 2 is a cross-sectional view taken along line 2—2 of FIG. 1.

The first embodiment of the present invention is a wear-resistant or abrasive article 36 (FIG. 1 ) which includes a square matrix, backing member or carrier 38 of plastic or metal that has a mounting area or surface 40 and a back surface 42 (FIG. 2). A plurality of single cubic crystals 50 (FIGS. 1 and 2) of diamond have first portions 52 (FIG. 2) individually embedded in the matrix and second portions 54 projecting outwardly from the mounting surface.

Figure 3:
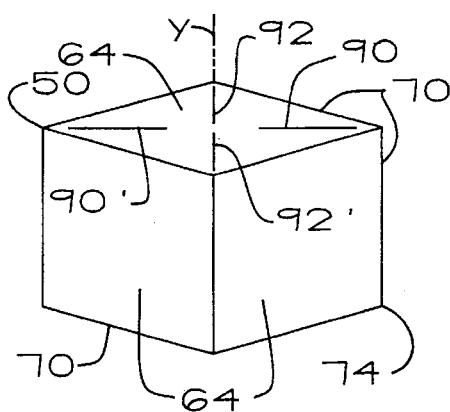
FIG. 3 is an isometric view of a single, synthetic, cubic crystal of diamond as used in the article of FIG. 1 but greatly enlarged from FIG. 1.
Figure 4:
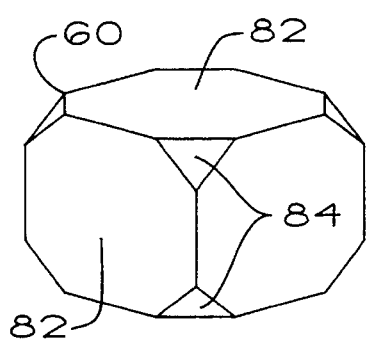
FIG. 4 is an isometric view of a single, synthetic, predominately cubic crystal of diamond, but with small octahedral facets, as used in the present invention and also greatly enlarged from actual size.

The use of single, synthetic diamond crystals, 50 in FIG. 3 and 60 in FIG. 4, as abrasive particles, is important to the present invention, and thus reference is now made to certain details about such crystals. In general, these crystals are regular polyhedrons but are produced in various specific shapes, namely, perfect cubes (FIG. 3); a range of cubo-octahedrons where the crystal faces vary from predominately cubic and minimally octahedron ( FIG. 4) to predominately octahedron and minimally cubic (not shown ); and perfect octahedrons (not shown). It is preferred to use perfectly cubic crystals, as shown in FIG. 3, or predominately cubic crystals where the cubic faces predominate and the octahedral facets are minimal in size, as shown in FIG. 4. The principles of this invention, however, apply to other shapes of the cubic crystal system, to which diamond belongs, as will be understood in the subsequent description of the third embodiment of this invention using cubic boron nitride.

The cubic crystal 50 (FIG. 3) represents the described commercially available synthetic diamond crystals which are tip to about l mm in size. The crystal 50 has six side faces 154, twelve edges 70, and eight corners 74. These faces are of course square and are referred to in the art and herein as cubic faces or as being in cubic planes.

The cubo-octahedral crystal 60 (FIG. 4) also represents commercially available synthetic diamond crystals and has six faces 82, which are commonly referred to as cubic faces since that is their predominate shape, and eight smaller octahedral facets 84 at the corners. Crystal 21 is thus referred to as a predominately cubic crystal since the octahedral facets are relatively small as compared to the cubic faces.

Figure 5:
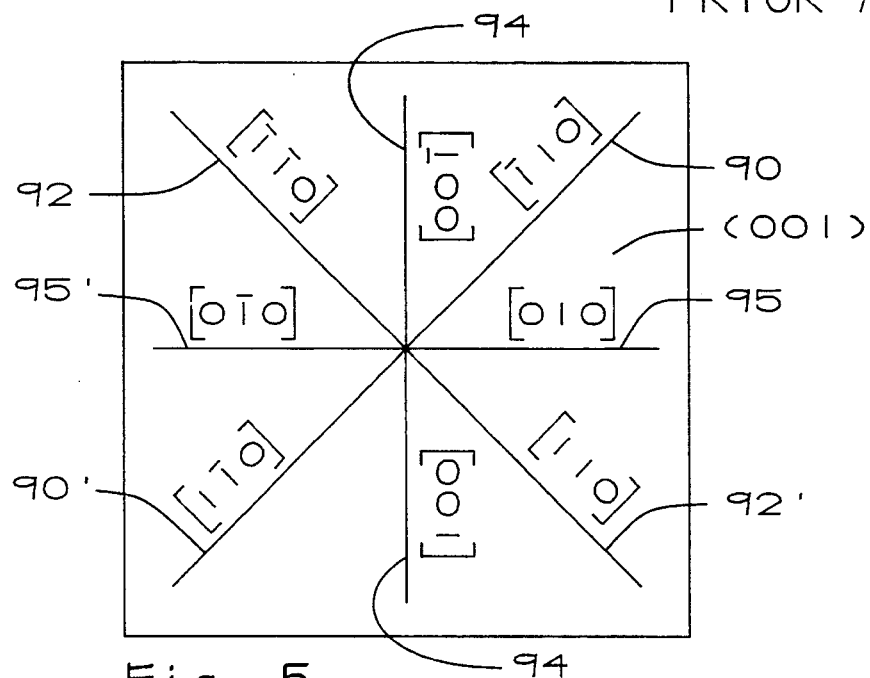
FIG. 5 is an enlarged view of a face of the cubic crystal of FIG. 3 showing directional lines of hardness and the Miller indices of the cube face and hardness directions.

With reference to FIG. 5, a brief description is set forth of certain known crystallographic characteristics of a synthetic diamond crystal, as 50 and 60, which are finally exploited in the present invention. FIG. 5 shows one of the faces 64 of the crystal 50. The crystal has crystallographic directions of maximum abrasive resistance or hardness in the plane of this cube face along the diagonal lines 90, 90' and 92, 92' of the face. It also has crystallographic directions of minimum abrasive resistance or hardness along lines 94, 94' and 95, 95' which are forty-five degrees frown the diagonals or directions of maximum resistance. Therefore, the crystal exhibits degrees of directional hardness ranging from the diagonal maximum directional lines to the right-angular minimum directional lines. These lines of hardness may also be described as being tangential to their respective faces of the crystal. The appropriate Miller notations for the face and directional lines are denoted in FIG. 5. In view of the symmetry of the crystallographic structure of diamond crystals, each face of the crystal has the same crystallographic directions of hardness within the plane of its face.

Brief reference to certain nomenclature regarding the symmetry of crystals, as 50 or 60, (FIGS. 3 and 4) will be useful in the subsequent description. As is known, the crystal has several planes of symmetry. One such plane is referred to in the art as a cubic plane which is an orthogonal plane which cuts through the crystal between and parallel to a pair of opposite faces, as 64. Another plane of symmetry is referred to in the art as a dodecahedral plane and is a diagonal plane that cuts through the crystal and contains a pair of opposite edges, as 70. The crystal also has several axes of symmetry one of which is represented, for example, by the letter y in FIG. 3 and passes through the center and opposite faces of the crystal and is perpendicular to such faces. Reference will be made to these planes and axes in the following description and claims.

Having described known characteristics of synthetic cubic diamond crystals 50, 60, the present invention is primarily concerned with the orientation of these crystals in a predetermined manner in the matrix 38 of the article 36, one embodiment of which is shown in FIGS. 1 and 2. It is to be noted that FIG. 1 is drawn about four times actual size since the synthetic cubic diamond crystals available are up to about 1 mm in size. It is also noted that for ease of illustration only perfectly cubic crystals are shown in FIG. 1 although in actual practice some of the crystals may be predominately cubic, as 60, and thus may have small octahedral facets 84.

In FIGS. 1 and 2, each crystal 50 is individually mounted in the matrix 38, with its first or mounting portion 52 (FIG. 2), which is approximately half of the crystal, embedded in the matrix. ,and its second or abrading portion 54 which the other approximate half of the crystal, outside of the matrix. Another way of expressing the orientation of each crystal in the matrix is to state that each crystal is mounted in the matrix with one of its cubic planes parallel to the mounting surface 40. The face 64 of each crystal at the extremity of the abrading portion 54 is referred to as an abrading face and is parallel to the mounting surface 40 and coplanar with the abrading faces of all the other crystals. These coplanar abrading faces thus define a working surface 96 for the article 36.

Incidentally, the amount of extension of the crystals 50 into or out of the matrix 38 is important to proper functioning of the article 36, but it is not a feature of the present invention. In the embodiment shown in FIG. 1, it is preferred that the mounting portions 52 of the crystals 50 are embedded in the matrix 38 a distance of about 0.6 mm, sufficient to hold the crystals securely in the matrix so as to prevent their dislodgment when force is applied to the crystals upon workpiece engagement, while providing sufficient workpiece engaging surfaces. Specific techniques for bonding abrasive particles, such as the crystals 50, 60, in a plastic or metal matrix are well-known but are subsequently briefly generally described herein as a part of the subject method.

The crystals 50 in the embodiment of FIG. 1 are preferably uniformly distributed about the matrix 38 in a checkerboard pattern and for this reason are arranged in orthogonal rows, indicated by lines 97, 98, and diagonal rows indicated by lines 99, 100, relative to the square matrix. The rows are in spaced relationship, and adjacent crystals in each row are spaced from each other. It is to be understood that the specific square shape of the matrix, the, specific checkerboard pattern or row formation, the specific crystal spacing, and the density or concentration of crystals shown in FIG. 1 are not essential to the invention and may be varied depending on the application of the article 36.

Of prime significance to the invention, however, is the orientation of the crystals 50 relative to each other. With reference to FIG. 1, the crystals are individually fixed in the matrix 38 with their maximum directions of crystallographic hardness, as 90 (FIG. 5), 90', aligned along parallel diagonals of the matrix which run in NE/SW directions, to use a compass analogy. Likewise, the directions 92 (FIG. 5), 92' are aligned along the NW/SE diagonals. It will of course be apparent that orientation of the crystals is not limited to such specific compass directions nor to the orientation of the article on the drawing sheet. With such an orientation, the lines of maximum hardness directions of the crystals in each diagonal row 99 are aligned along common lines, as 10 1, 102, and these common lines of all the diagonal rows are parallel with each other. Stated otherwise, corresponding lines of maximum hardness directions of individual crystals are either in alignment, or parallel, with corresponding lines of maximum hardness of all the other crystals. Also, these lines 90, 90' and 92, 92' of maximum hardness are tangential to their respective face extremities 64, lie in the working surface 96, and are parallel to the mounting surface 40 of the matrix 38.

It is to be observed that as used herein and in crystallographic terminology, the words "align" and "aligned" mean pointing in the same direction, but can also mean being coincident with a single line. Thus, the lines of maximum hardness 90 of the crystals 50 in FIG. 1 are "aligned" in the sense that they all point in a NE direction in FIG. 1, whereas those directional lines 90 of the crystals in a given diagonal row are "aligned" in that they are coincident along a common line.

Conversely, corresponding lines, as 94, of minimum hardness directions of all the crystals 50 (FIG. 1) in each of the NS orthogonal rows 97 are in alignment and all of the corresponding minimum hardness lines in each such row are parallel with those in the other NS rows. The same is true for the EW rows. The lines of minimum hardness are thus also tangential to their respective face extremities 64, lie in the working surface 96, and are parallel to the mounting surface 40.

Therefore, it will be understood that the array, group, or formation of crystals 50 (FIG. 1 ) exhibits common directional lines, as 101 and 102, of maximum hardness which run diagonally of the matrix 38 and are parallel to the mounting surface 40. If the working surface 96 (FIG. 2) is moved across a workpiece, not shown, in one of these diagonal directions, such as NE/SW, the crystals will exhibit their maximum hardness to the workpiece. Conversely, if the working surface is moved relative to a workpiece in the direction at forty-five degrees from common line 102, that is in a NS or EW direction, the surface will exhibit its minimum hardness to the workpiece. The working surface formed by the crystals thus exhibits common directions of maximum and minimum hardness and all the degrees of hardness in between, just like an individual crystal. With the present invention, then, the characteristics of an single crystal are imparted to the entire array of crystals.

With reference to FIG. 2, since the abrading portions 54 of the crystals 50 project outwardly of the matrix 38 equidistantly from the mounting surface 40 with their faces 64 defining the planar working surface 96, the crystals are able to contact a workpiece, not shown, simultaneously and thus apply force to the workpiece in an even manner. Wear on the crystals, and abrasion action on a workpiece, are therefore uniformly distributed.

Method of Making the First Embodiment of the Article

Figure 6:
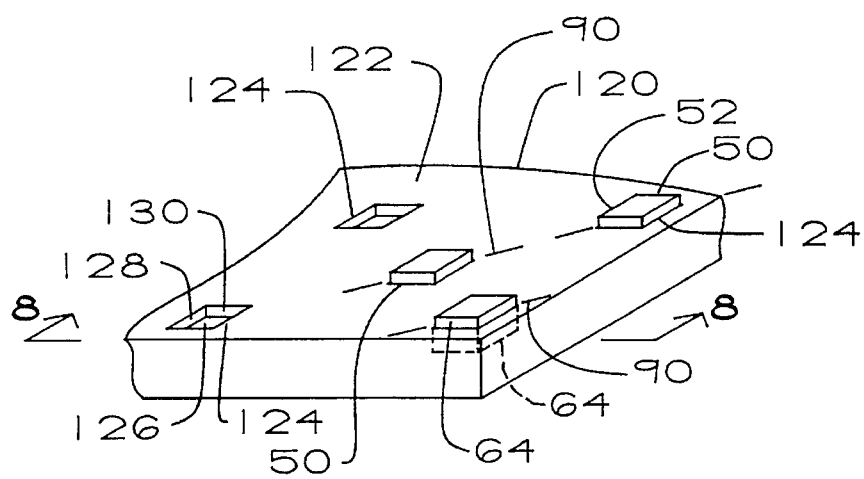
FIG. 6 illustrates a step of the method of the present invention and specifically is an isometric view of a corner of a template containing three cubic crystals oriented by the template into desired positions.

The method for making the first embodiment of the article 36 (FIG. 1) of the present invention is described with reference to FIGS. 6–9. The method employs a template 120, only a portion of which is shown in FIG. 6. The template has a top surface or plate 122 and a plurality of half-cubic shaped recesses, wells, or pockets 124 extending downwardly into the body of the template from the top surface and serving as receptors for the crystals 50. Each recess may be described as having the shape of a part of a cube cut along one of its cubic planes. Since only a portion of the template 120 is shown, only a few of the recesses are shown. It will be understood, however, that a complete template is slightly larger than the abrasive article 36 and has the same number and formation of recesses as there will be crystals in the article to be made. Thus, a complete template for making the article shown in FIG. 1 includes fifty recesses in ten rows of five each, running in both the length and the width of the template, with the recesses in adjacent rows offset from each other.

The recesses 124 (FIG. 6) in the template 120 are of uniform shape and size. Each recess has a length and width (that is, the dimensions which lie in the plane of the surface 122) slightly greater than the edge dimensions of a cubic crystal 50, and a depth not quite as deep as such edge dimension. Thus, in this embodiment of the method, the recesses are slightly larger than 1 mm square and are about 0.6 mm deep. Each recess has a bottom wall 126, and side and end walls 128 and 130 which are at right angles to the bottom wall. The recesses may be configured with slightly beveled inside corners, not shown, similar to the shape of the facets 84 of the predominately cubic crystals 60 (FIG. 4) that have minor octahedral facets.

Figure 8:
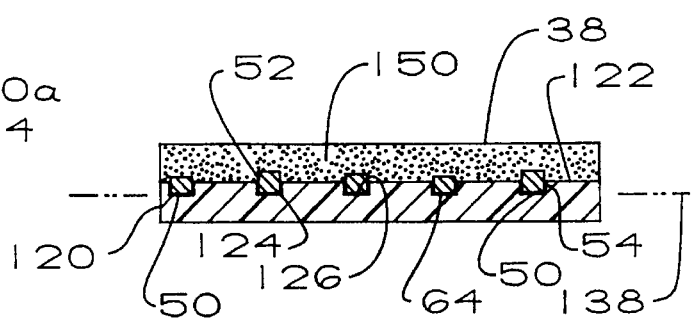
FIG. 8 illustrates another step of the method of the present invention and specifically is a cross section of the template and crystals therein, as if taken along line 8—8 of FIG. 6 when the template is full of crystals, and further showing a matrix of epoxy overlaying the crystals and the template.

Significantly, the recesses 124 (FIG. 6) are oriented in the template 120 in positions which will orient the crystals 50, 60 so that their corresponding crystallographic maximum hardness directions, as 90, are aligned. Thus, all of the side walls 128 are parallel with each other, and all of the end walls 130 are parallel with the other end walls. To achieve equidistant projection of the crystals from the matrix mounting surface 40, all of the bottom walls 126 are in a common plane 138 (FIG. 8).

Alternatively, a modified template 120a (FIG. 7) with modified recesses 124a may be used. Here, the bottom wall 126a of each recess 124a is angled upwardly a few degrees from the common plane 138. More specifically, the bottom wall 126a is angled diagonally upwardly from one bottom corner of the recess to the diagonally opposite corner. It will be understood that corresponding corners, for example, all the NE corners, are similarly tilted upwardly so as to make the angulation uniform throughout the template 120a.

The templates 120 or 120a (FIGS. 6 and 7) are made of plastic, such as polyethylene or tetrafluoroethylene, or of metal, such as steel or aluminum, and are shaped by casting the plastic or metal against a master form, not shown, having cube-shaped protrusions. Alternatively, the template is made by stamping or pressing plastic or metal stock with an appropriately shaped master multiple projection die or a single cube-shaped die, again not shown since such metalworking techniques are well known in the art.

In carrying out the method of' the present invention, a supply of synthetic single diamond crystals 50, 60 of cubic or predominately cubic shapes and of approximately the same size, currently about 1 mm, is selected. It is important to size the crystals by precision screening, preferably using screens with square openings. Further shape control by automated single crystal weighing or settling in a fluid using Stokes Law may be used.

Figure 7:
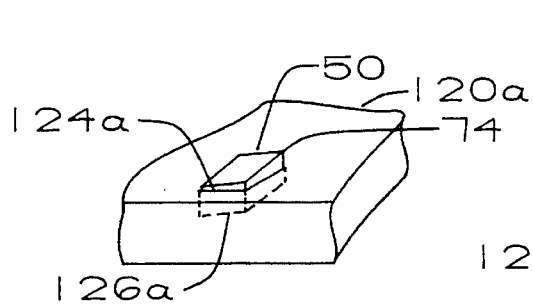
FIG. 7 illustrates a portion of an alternate form of template used in practicing the method referred to in regard to FIG. 6.

With the top surface 122 (FIG. 6) of the template 120 maintained in a generally horizontal plane, crystals 50, 60 are deposited on the top surface and spread thereover and thus lie in random orientation about the top surface. More crystals are deposited than there are recesses 124 so as to insure a quantity sufficient to fill all the recesses. The template is vibrated or tapped and, if necessary, slightly tilted to cause the crystals individually to gravitate into and be received by the recesses. Because of the complementary shapes of the recesses and the crystals and the slightly larger recess size relative the crystal size, crystals are individually accommodated into the recesses where they each stabilize, with one bottom face 64 of each crystal lying flat on the bottom wall 126 of its recess and with its side faces 64 in adjacent parallel relation to the side and end walls 128 and 130. The crystals project frown the top surface 122 of the template a distance less than their edge dimension, preferably about 0.4 mm in the illustrated embodiment. If the template 120a using inclined bottom walls 126a is employed, as shown in FIG. 7, corresponding top comers 74 of the crystals 50 are tipped up relative to their diagonally opposite top comers along a diagonal, as 99 (FIG. 1 ), of the template. While all of the recesses are being filled or after they are filled, the template is inclined slightly and again vibrated or tapped in order to remove excess crystals from between the rows, so that the top surface 122 is clean of crystals while maintaining the crystals in the recesses into which they were received and in their oriented positions therein.

Each recess 124 or 124a (FIGS. 6 and 7) is thus temporarily filled with a crystal 50 or 60, and the crystals are thus oriented with all of their corresponding crystallographic directions of maximum hardness 90, 90' and 92, 92' aligned and the corresponding directions of minimum hardness, as 94, 94' and 96, 96', likewise aligned. The bottom faces 64 of the crystals lie flat against the bottom walls 126 of their recesses and thus coplanar with plane 138, and the first or mounting portions 52 of the crystals protrude outwardly from the template.

Figure 9:
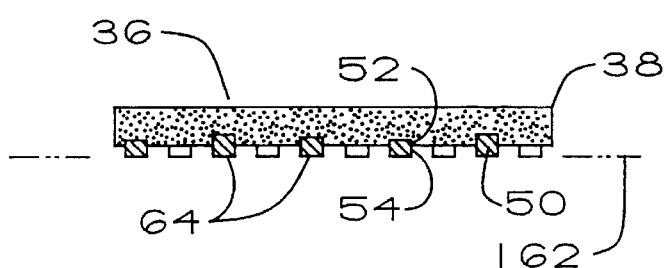
FIG. 9 is a cross-section taken along the same plane as FIG. 8 but showing the matrix and the crystals, that is the abrasive article, removed from the template.

The subject method next involves steps for fixing the crystals 50, 60 in the described orientation and for removing them from the template, as 120 (FIG. 6). The template used has a non-adhesive top surface 122 and non-adhesive recess walls 126, 128 and 130, which can be accomplished by making the template of polyethylene or tetrafluoroethylene as previously suggested. A layer 150 (FIG. 8) of uncured plastic, such as an epoxy resin, is applied over the top surface 122, covering and completely immersing the mounting portions 52 of the crystals in the plastic. This layer is then cured and upon curing, this overlay of plastic becomes the matrix 38 fixing the crystals in their positions of crystallographic alignment with the faces 64 resting against the bottom walls 126 of the recesses 124 in their coplanar relationship. The matrix and the array of crystals are then removed as a unit from the template thereby yielding the article 36 (FIG. 9).

In its basic form, the article 36 (FIGS. 1, 2 and 9) comprises only one layer of crystals 50 and may be of any practical surface area with any practical number of crystals, limited only by the particular use or application of the article. By way of example only, the article 36 includes fifty crystals, each measuring about one millimeter square, in a matrix 38 measuring about 25 mm×25 mm×5 min.

If desired for some applications, multiple articles, as 36, may be bonded together in edge-to-edge coplanar relation to form a much larger surface area, not shown. Also, multiple articles may be bonded together in stacked, layered relation, also not shown. In any case, all the crystals are positioned so that their crystallographic directions are oriented in the same direction, in accordance with the principles of this invention.

Article of Manufacture—Second Embodiment

The second embodiment of the article is identified by numeral 236 in FIGS. 10 and 11. This article also conveniently includes a square matrix 238 having a mounting surface or area 240. Synthetic cubic crystals 50, and/or 60, are used for this embodiment and are the same as used for the first embodiment in FIG. 1. As before, the crystals are preferably uniformly distributed about the mounting surface and are positioned in orthogonal and diagonal rows in a checkerboard pattern. The second embodiment differs from the first embodiment, however, in the orientation of the crystals, but this different orientation still aligns selected hardness directions.

Again, it is helpful to set forth certain crystallographic principles as a foundation for understanding the second embodiment. With reference to FIG. 12 and 13, it is known that the second hardest crystallographic direction of hardness of a diamond crystal 50 or 60 is along a line 248 which is tangential to an edge 70 of the crystal and also perpendicular to the diagonal 249 (FIG. 13) of the crystal which intersects such edge. The appropriate Miller notation for this second hardness directional line is denoted in the drawings. It will be understood that there is a similar second hardest directional line tangential and perpendicular to each edge of the crystal. It is also to be noted that the crystal 50 has another axis of symmetry represented by the diagonal 249, and that this axis passes through one edge of the crystal, through the center of the crystal, and through the opposite edge and is perpendicular to such edges.

To take advantage of this second hardest direction, the crystals 50 (FIGS. 10 and 11) are individually mounted in the matrix 238 so that a dodecahedral plane of each crystal is co-planar with the mounting: surface 240, or is slightly on one side or the other of such mounting surface and parallel to it. It follows, then, as best visualized in FIG. 11, that the dodecahedral plane which is perpendicular to the first-mentioned dodecahedral plane is perpendicular to said mounting surface. With such mounting, the approximate half of each crystal on one side of the mounting surface is embedded in the matrix, and the other approximate half is outside the matrix. Of greatest significance, all the exposed edges 70a, which are referred to as abrading edges, of the crystal-halves are parallel to, or in alignment with, each other; are equidistant from and parallel to the mounting surface; and together define a working surface 250 (FIG. 11 ). Thus, the crystals are oriented in the matrix so that their crystallographic directions of hardness as indicated by the lines 248 (FIG. 10) are aligned with, or parallel to, such directional lines of all the other crystals, depending on whether their crystals are in the same EW row 252 or in a parallel EW row.

Thus, when the abrading edges 70a (FIGS. 10 and 11) of the article 236 are in contact with and moved relatively to a workpiece, not shown, in the direction of the lines 253,254 (that is, the EW direction in FIG. 10), the combined effect of aligned hardness directions of the crystals 50 is presented to the workpiece. Although the hardness direction 248 is not the hardest direction of the crystal, it is the next-to-the-maximum hardness direction and thus allows an improved abrasive force to be applied by the crystals, as contrasted with non-aligned directions of hardness of grits, particles or crystals which are randomly positioned with regard to crystallographic direction, as practiced by the prior art.

Method of Making the Second Embodiment of the Article

The article 236 (FIG. 10) is made in a manner similar to the article 36 (FIG. 1), except that a different template 260 (FIG. 14) is utilized to accommodate the different orientation of the crystals 50. In template 260, only a portion of which is shown in FIG. 14, recesses 264 are in the shape of an approximate cube-half, when the cube is cut along a dodecahedral or diagonal face-plane thereof. In other words, the recesses are V-shaped with a ninety degree included angle. In general, the parameters for construction the template and the recesses are the same as for template 120 (FIG. 6). That is, the recesses are slightly larger than the crystals so as to facilitate accommodation of the crystals therein, and they have end walls 265 and side walls 266 that meet at bottom corners or edges 268 which are tangent to and lie in a common plane 270 (FIG. 15).

An alternative template 280 (FIG. 18) may be used with the second embodiment of the method. This template has V-shaped recesses, grooves or troughs 282 having side walls 284, end walls 286, and bottom edges 288, which are the same shape as the recesses 264 except that they extend almost the full length or width of the template, being enclosed by the end walls 286.

As with the method described with reference to FIGS. 6–9, a similar method is followed to make the article 236 (FIG. 10). In brief, sorted, substantially uniformly sized crystals 50 are distributed in a random manner over the template 260, or 280, and the template is vibrated to cause the crystals to fall into the recesses 264, or 282. In the recesses 264, there is one crystal per recess, but with recesses 282, a line of crystals is accommodated with adjacent faces 64 of adjacent crystals preferably being in contact. Again, the templates 260 or 280 are inclined slightly and vibrated or tapped to remove excess crystals while maintaining the oriented crystals in the recesses.

Next, an uncured plastic: layer 290 (FIG. 15) is placed over the template 260, or 280, to cover the protruding portions of the crystals 50 and then is allowed to cure and harden. When cured, the plastic layer becomes the matrix 238 with the crystals fixed therein and is removed frown the template thereby resulting in the article 236 (FIGS. 16 and 11).

Article of Manufacture—Third Embodiment

The third embodiment of this invention provides an article 336 (FIGS. 19–21) similar in principle to the articles 36 and 236 of the first and second embodiments except that the third embodiment uses single, synthetic crystals 350 of cubic boron nitride (CBN). The article includes a matrix or carrier 338 for the crystals which has a mounting surface 340 and a back surface 342.

Cubic boron nitride, like diamond, is in the cubic class of crystals, but, unlike diamond, has the sphalerite structure. The CBN crystal 350 (FIG. 22) is thus a regular polyhedron like diamond but, unlike diamond, has a tetrahedral shape. Individual crystals of CBN of good quality are commercially available, with planar triangular faces 352 meeting in sharp edges 354 and corners 356, and have dimensions of up to about 0.5 mm on an edge. It is important to emphasize that, like the embodiments 36 (FIG. 1) and 236 (FIG. 11) of this invention utilizing diamond crystals, the CBN used for the third embodiment is in the form of single or individual crystals and not the CBN grains used in the prior art as abrasive grains or grit that are predominately crashed aggregates of intergrown, randomly-oriented crystals. Like the other embodiments, use of single, substantially uniform crystals allows predetermination of the crystallographic directions, manipulation of the crystals, and resultant orientation into the desired positions.

As is known, the tetrahedral crystal, as 350, has several planes and axes of symmetry. One such axis is referred to in FIG. 23 by the reference letter p and is a useful in describing and claiming the present invention. The axis p passes through the center of one edge of the crystal, through its center and through the center of the edge opposite to the first edge, and is perpendicular to both such edges.

No careful work is known that has correlated the variation of abrasion-resistance of the CBN crystals, as 350 (FIG. 22), with crystallographic direction. The similarity, however, between the internal atomic configurations of CBN and diamond leads to the conclusion that the most abrasive-resistant direction of a CBN crystal is along a line, as 360 (FIGS. 19, 22–24), which is perpendicular to an edge, as 354a, of the crystal. This directional line may also be described as tangential to the edge 354a and parallel to the opposite edge 354b, as best illustrated in FIG. 23. It is of course understood that the edge 354a is chosen by way of example only and that there is such a directional line of maximum hardness perpendicular and tangential to each of the edges 354. Miller notations for faces of a CBN crystal are shown in the FIGS. 22–24.

The crystals 350 (FIGS. 19–21) are mounted in the matrix 338 so that a plane cutting through each crystal and parallel to a pair of its opposite, perpendicularly related edges lies approximately in or close to the mounting surface 340 (FIG. 20) of the matrix. Such a plane divides the crystal into two portions, so that with such a mounting, one of these portions is embedded in the matrix and the other portion is outside the matrix. In the preferred embodiment illustrated in FIGS. 19–21, about sixty percent of each crystal is embedded in the matrix and the remaining forty percent protrudes out of the matrix. The important feature, however, is that the exposed edge 354a of said opposing pair of edges of each crystal is parallel with the corresponding exposed edges of all the other crystals, as is readily seen in FIG. 19, and with the mounting surface 340. Also, these edges 254a of crystals in the same NS row, as 366, are in alignment.

As previously mentioned with regard to the other embodiments, the third embodiment of the invention is not limited to the specific spacing or number of crystals 350 (FIG. 19) or rows, nor to the orthogonally formed rows, nor to the number or concentration of crystals. It is important to the invention, however, that the crystallographic lines 360 of maximum hardness of corresponding edges, as 354a, of all the crystals are in alignment, or are parallel, with each other. Such alignment or parallelism of the crystallographic lines follows from mounting the crystals with the exposed edges 354a in alignment or parallel with each other.

Method of Making the Third Embodiment of the Article

This embodiment of the method is similar to the other two method embodiments except that templates 390 and 392 (FIGS. 25 and 28), similar to the templates 280 (FIG. 18) and 260 (FIG. 14), respectively, are constructed to accommodate the tetrahedral, CBN crystals. The article 336 illustrated in FIG. 19 is made using the template 390 in FIG. 25. The template 390 has elongated V-shaped recesses or troughs 394 with end walls 396 and side walls 398 meeting at predetermined angles in bottom corners or edges 400 which are all in a common plane 406 (FIG. 26).

As an example, the entire template 390, only a portion of which is shown in FIG. 25, may be approximately 32 mm×15 mm×5 mm in size and be made of high density polyethylene. The recesses 394 may be milled lengthwise of the template to a depth of about 0.5 mm and so that the side walls 398 have an included angle of about 70°32 ', ±5°.

With the template 390 (FIG. 25) maintained in a horizontal position, crystals 350 of CBN of pre-sorted, substantially uniform size are sprinkled on the template and thus randomly positioned thereon. By vibrating and slightly tilting the template, the crystals are caused to drop into the recesses 394 with an edge 354a (FIG. 26) of each crystal fitting against the bottom edge 400 of a recess, and thus being tangent to the common plane 406, and with two opposite side faces 352 (FIG. 25) resting against the side walls 398 of the recess and with slightly less than half of each crystal protruding outwardly from the template. Tilting file template toward one end while vibrating and tapping the same also causes excess crystals on the top surface of the template and between the recesses to drop off the template.

Epoxy resin (system three, phase two) is then poured over the template 390 so as to provide a layer 410 (FIG. 26) of about 5 mm depth covering the projecting portions of the crystals 350. The resin is then cured at about 60° C. for about two hours, causing the resin to cure and harden and form the matrix 338. The crystals are thus individually fixed in the matrix of their oriented positions in the template. The matrix and its attached crystals are then removed from the template thus resulting in article 336 (FIG. 27) wherein all of the exposed edges 354a of the crystals are parallel to each other (FIG. 19), thereby causing the crystallographic directional lines 370 of maximum hardness to be either aligned or parallel to each other and lying in the common plane of the work surface 420 (FIGS. 20, 21 and 27) defined by the edges 354a. It will be understood that the coplanar relation of the edges 354a results from the bottom edges 400 of the recesses 394 lying in a common plane 406 (FIG. 26).

It will now be understood how the template 392 (FIG. 28) having spaced V-shaped recesses or pockets 426 is used to create an article, not shown, with crystals 350 temporarily placed in the pockets, individually fixed in a matrix, not shown, and then removed, to produce such an article very similar to article 236 (FIG. 10), but with CBN crystals instead of diamond crystals.

Figure 28:
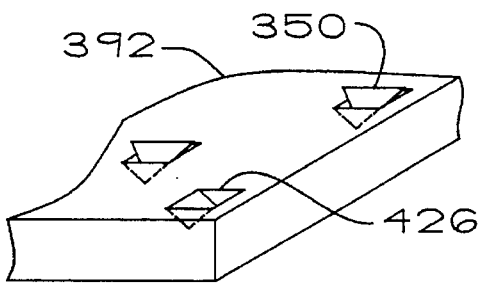
FIG. 28 is an isometric view of a corner of a template used to make a variation, not shown, of the embodiment shown in FIG. 19.

The recesses, trough or grooves 394 and 426 (FIGS. 25 and 28) that act as receptors of the crystals 350 to align the crystals can be chosen to be of a length slightly longer than the length of an edge of a CBN crystal, in the case of the recesses of FIG. 28, or any multiple of this length in the case of the recesses of FIG. 25. Thus, the pattern and density of the crystals can be adjusted to make optimum use of the CBN crystals for workpiece treatment.

By now it will be understood that the template, as 120, 260, 280, 390, or 392, used in the present invention is not limited to the particular recess or well configurations shown, but more broadly, the template is understood to have a receptor area shaped to accommodate and align the crystals 50 or 350, such receptor area including either a plurality of recesses or pockets or wells, as 124 or 264 or 426, or one or more troughs, as 282 or 426 or 394.

In all the embodiments of this invention, it will be understood that bonding agents other than epoxy resin or other plastic formulations may be used, as are well known in the art. Briefly, with the templates 120, 260, 280, 390, or 392 made of graphite, a powdered infiltration metal or a powdered infiltrator alloy with abrasion-resistant particles, such as tungsten carbide, can first cover the crystals 50 or 350. The assembly can then be heated to fuse the metal and create the matrix 38, 238 or 338, fixing the crystals in their oriented positions. Also, metal, such as nickel, can be electrodeposited over the crystals in the template to serve as the matrix by a well known process. Still further, any of the templates may be made of a refractory material not bondable to fired ceramic bodies, such as graphite or silicon carbide. An unfired plastic ceramic could then be layered over the crystals in the template and subsequently heated to a temperature suitable to sinter the ceramic body, whereby a vitreous matrix embeds the crystals in their oriented positions.

Figure 29:
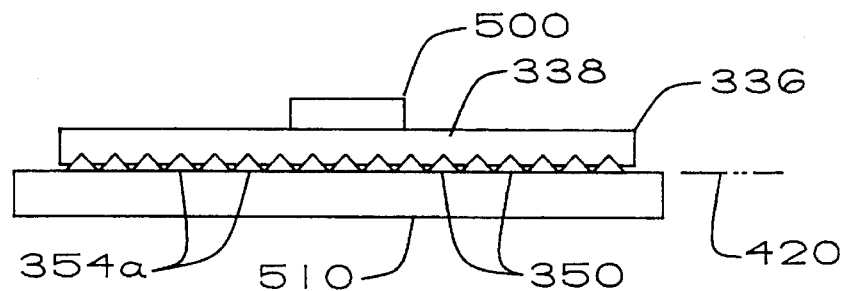
FIGS. 29 and 30 are schematic views showing how the articles of the present invention are used in a tool to surface a workpiece along a linear path but specifically showing the article of FIG. 19.
Figure 30:
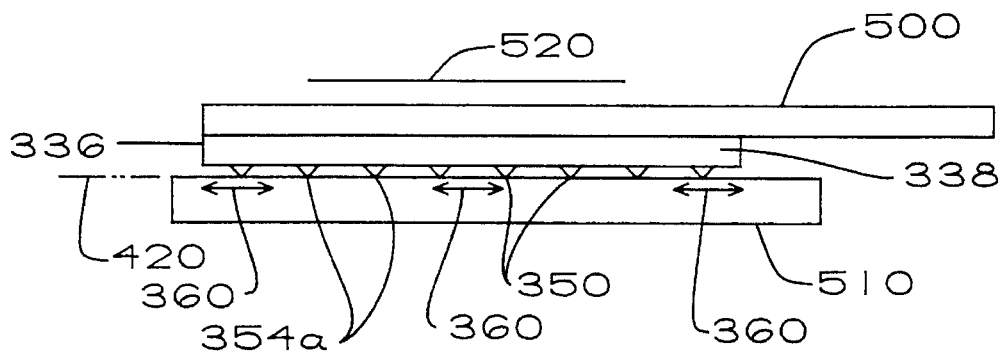

FIGS. 29 and 30 show one of the articles, as 336, constituting part of a tool 500 which moves relatively to a workpiece 510 along a linear path 520. It will be noted that the edges 354a contact the workpiece together since they are tangential to a common plane or work surface 420. Also, the crystals all move across the workpiece perpendicularly of the edges 354a or, in other words, along the common lines 360 (FIG. 30) of directional hardness of all of the crystals. Each individual crystal engages the workpiece so that its predetermined line of maximum hardness 360 is aligned with the path 520 of movement of the crystal. Therefore, a maximum amount of abrasive action is exerted by the crystals.

Figure 31:
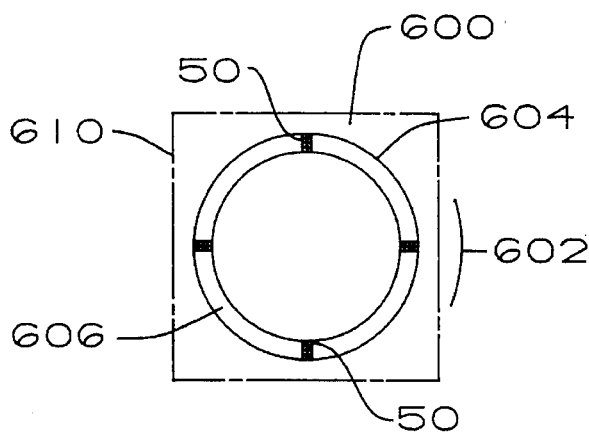
FIGS. 31 and 32 are schematic views showing how the articles of the present invention are used in a tool to surface a workpiece along a rotary path but specifically showing articles made in accordance with the embodiment of FIG. 17.
Figure 32:
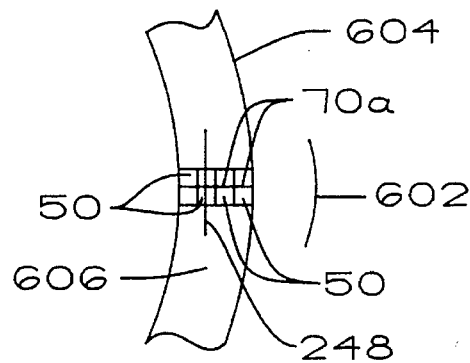

FIGS. 31 and 32 illustrate the principles of the present invention for use in a tool 600 which surfaces a workpiece along a rotary path 602. The tool comprises a sleeve 604 having an annular end 606, and a plurality of crystals, as 50, mounted on the end so that the sharp edges, as 70a, are oriented radially of the sleeve. In this manner, the crystals engage the workpiece 610, shown in phantom outline in FIG. 31, so their individual lines 248 of high hardness are aligned with the rotary path 602 of the crystals. Although the drawing shows groups of crystals mounted at each quadrant at the end of the, sleeve, the crystals can be spaced or mounted in a continuous formation about the circumference. The important point is that the crystals are mounted so that each crystal contacts the workpiece with its line of high hardness aligned with the path of movement of the crystal.

In summary of the present invention and its advantages, each of the described embodiments mounts a plurality of single synthetic crystals, as 50 and 350, of substantially uniform size and shape, and of diamond or CBN, in a matrix, as 38, 238 and 338, so that all the crystals are oriented with corresponding hard-to-abrade directions aligned. With the first and third embodiments in FIGS. 1 and 19, the hardest-to-abrade directions are aligned, whereas with the second embodiment of FIG. 10, the next-to-the hardest directions are aligned. In all embodiments the exposed workpiece-engaging extremities, as 64, 70a, and 354a, of the crystals lie in a common plane for simultaneous workpiece engagement even though some of the crystals are of slightly differing sizes. With the second and third embodiments of FIGS. 1 0 and 19, sharp edges, as 70 and 354, are presented to a workpiece, and with the variation of the first embodiment (FIG. 7), sharp corners, as 74, are presented. In the embodiments of FIGS. 7.10, 19, therefore, the sharp edges or sharp corners are in a saw-tooth formation which together with the aligned hardness directions produce an especially effective abrading action. It is also to be noted that the spacing between the crystals facilitates removal of abraded material as a workpiece is being processed.

From the foregoing, the following advantages, inter alia, of the present invention will be understood. Since only the hardest-to-abrade directions are presented to a workpiece, the abrasive article: has increased life thus saving abrasive material; abrades faster; requires less frequent replacement of parts; maintains dimensional tolerances longer; minimizes adjustment for wear compensation; reduces dulling and flailing; and allows variation of abrasive concentration and thus facilitates its optimization. Furthermore, since all of the workpiece-engaging extremities of the crystals lie in a common plane, even though the individual crystals may vary somewhat in length, the crystals engage the workpiece simultaneously and uniformly thereby enabling uniform removal of material from the workpiece and avoiding the problems of grains which stand high and slow the abrasive action. All of the above stated features and advantages have the effect of reducing cost, time and labor and improving abrasive action.

The terms "abrasive" and "abrading" are sometimes used in the art in a very specific sense to mean a very specific type of workpiece treating action. It is to be understood, however, that as used herein, these terms are not limited to such a specific meaning but include cutting, grinding, dressing, lapping, sawing, or otherwise treating or engaging workpieces in the multitude of ways in which a hard surface or tool is used. It is also to be noted that the principles of the invention are more broadly applicable to wear-resistant surfaces which are useful not only as workpiece-treating elements but as bearing elements.

Furthermore, although preferred embodiments have been shown and described, various modifications and substitutions may be made thereto without departing from the spirit and scope of the invention. Accordingly, it is to understood that the present invention has been described by way of illustration and not limitation.

What is claimed is:

1. An article of manufacture, comprising:

a plurality of particles each having a predetermined directional line of maximum hardness, said particles being oriented in a formation so that all of said predetermined directional lines of maximum hardness are aligned in the same direction, and means holding the particles in said formation so that they can engage a workpiece while resisting displacement from the formation when there is relative movement between the workpiece and the particles.

2. The article of claim 1 wherein each of said particles is a single crystal, each of said crystals having a workpiece-engaging portion, wherein said directional lines of hardness include a crystallographic direction of hardness lying along a line tangential to its workpiece-engaging portion, said mounting means fixing the crystals in the formation with the workpiece-engaging portions exposed and projecting outwardly from the formation and with said crystallographic directions or hardness aligned in the same direction, said workpiece-engaging portions being tangent to and defining a working surface which exhibits a common direction of hardness across said surface.

3. The article of claim 1, wherein the crystals are single crystals, wherein said mounting means holds the crystals individually in the formation so that predetermined portions thereof project outwardly from the formation and are exposed for contacting a workpiece, wherein said directional lines or hardness include crystallographic directions of hardness lying along predetermined lines some of which are tangential to said predetermined portions, and wherein each crystal is individually oriented in the array so that the corresponding lines of hardness associated with said outwardly projecting portions are parallel to each other.

4. The article of claim 1, wherein the particles are single synthetic crystals having polyhedral shapes selected from the group consisting of cubes, cubo-octahedrons, and tetrahedrons and thus have planar face portions meeting in edge portions, said face and edge portions constituting abrading elements capable of abrading a workpiece;

wherein there are directional lines of hardness tangential to said abrading elements; and wherein each crystal is oriented in the formation so that one of its abrading elements protrudes from a common plane and so that all of the predetermined directional lines of hardness tangential to the protruding abrading elements are parallel to said common plane.

5. The article of claim 4, wherein the crystals are selected from the group consisting of diamond and cubic boron nitride.

6. An article having abrasive and wear-resistant qualities, comprising:

a plurality of synthetic single crystals of the same material, of substantially the same size, and of polyhedral shape, each of said crystals having faces and edges and a predetermined axis of symmetry, said faces and edges constituting workpiece-engaging elements of the crystals, and means mounting the crystals in a formation in which their axes of symmetry are generally perpendicular to a common plane, each crystal having the same orientation about its axis of symmetry as all the other crystals and having ,one of its workpiece-engaging elements protruding from said common plane for contact with a workpiece.

7. The article of claim 6, wherein the crystals are selected from the group of crystals consisting of diamond and cubic boron nitride.

8. An abrasive article, comprising:

a backing member having a mounting surface, a group of synthetic single crystals secured to the backing member in spaced relationship and distributed about said mounting surface, each of said crystals being a polyhedron with side faces meeting in edges of the crystal, each crystal also having predetermined directions of hardness along lines in the plane of each face and tangential to each edge whereby said faces and edges constitute abrading portions of the crystals, the crystals being oriented on the backing member with a selected abrading portion of each crystal projecting outwardly from the mounting surface with all the corresponding lines of hardness being either in substantial alignment or substantial parallelism so that the group of crystals exhibits a common direction of hardness.

9. The article of claim 8, wherein the crystals are, diamond of substantially cubic shapes and substantially uniform size, each crystal thereby having substantially square face portions meeting in edge portions, wherein said face and edge portions constitute the abrading portions of the crystals, and wherein all of said selected abrading portions project equidistantly outwardly from the mounting surface.

10. The article of claim 8, wherein one of the face portions of each crystal is the selected abrading portion.

11. The article of claim 10, wherein each abrading portion has corners, and wherein one corner of each abrading portion projects farther outwardly from said mounting surface than the other corners thereof to provide a plurality of sharp abrading elements.

12. The article of claim 8, wherein one of the edge portions of each crystal is the selected abrading portion.

13. The article of claim 8, wherein the crystals are cubic boron nitride of substantially tetrahedral shapes and of substantially uniform size, each crystal thereby having substantially triangular faces meeting in edges of the crystal, and wherein one edge of each crystal is its abrading portion.

14. The article of claim 13, wherein all of the abrading portions project equidistantly outwardly from said mounting surfaces and constitute said selected portions of the crystals.

15. An article of manufacture having the qualities of abrasiveness and wear-resistance including a plurality of synthetic single crystals of substantially the same polyhedral shape and of substantially the same size, wherein each of said crystals has a workpiece-engaging portion having at least one crystallographic direction of hardness which has substantially the same direction and degree of hardness as the corresponding crystallographic direction of hardness in the workpiece-engaging portions of the other crystals, said crystals being oriented in a group said crystals being oriented in a group so that said corresponding crystallographic directions of hardness are aligned and so that the workpiece-engaging portions are positioned to collectively exhibit a common crystallographic direction of hardness and for collectively engaging a workpiece; and means for securing the crystals together in said oriented group.

16. An article of manufacture comprising a formation of synthetic single crystals each having a predetermined crystallographic direction of hardness, said crystals being held in the formation with said predetermined crystallographic directions oriented in the same direction, said formation being created by physically moving the crystals from disoriented positions into their oriented positions in said formation.

* * * * *